(12) United States Patent
Xu et al.

(10) Patent No.: US 10,522,594 B2
(45) Date of Patent: Dec. 31, 2019

(54) RESISTIVE MEMORY WITH A PLURALITY OF RESISTIVE RANDOM ACCESS MEMORY CELLS EACH COMPRISING A TRANSISTOR AND A RESISTIVE ELEMENT

(71) Applicant: International Business Machines Corporation, Armonk, NY (US)

(72) Inventors: Peng Xu, Santa Clara, CA (US); Kangguo Cheng, Schenectady, NY (US); Juntao Li, Cohoes, NY (US); ChoongHyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/267,558

(22) Filed: Feb. 5, 2019

(65) Prior Publication Data

US 2019/0198571 A1   Jun. 27, 2019

Related U.S. Application Data

(63) Continuation of application No. 15/850,400, filed on Dec. 21, 2017, now Pat. No. 10,283,565.

(51) Int. Cl.
*H01L 27/115* (2017.01)
*H01L 27/24* (2006.01)
*H01L 29/66* (2006.01)
*H01L 45/00* (2006.01)
(Continued)

(52) U.S. Cl.
CPC .... *H01L 27/2454* (2013.01); *H01L 21/76897* (2013.01); *H01L 29/6656* (2013.01); *H01L 29/66666* (2013.01); *H01L 29/7827* (2013.01); *H01L 45/1253* (2013.01);
(Continued)

(58) Field of Classification Search
CPC .......................... H01L 27/115; H01L 27/2481
See application file for complete search history.

(56) References Cited

U.S. PATENT DOCUMENTS

| | | |
|---|---|---|
| 7,205,598 B2 | 4/2007 | Voshell et al. |
| 8,835,256 B1 | 9/2014 | DeBrosse et al. |
| 9,076,523 B2 | 7/2015 | Lee et al. |

(Continued)

OTHER PUBLICATIONS

I. G. Baek et al., "Realization of Vertical Resistive Memory (VRRAM) Using Cost Effective 3D Process" IEEE International Electron Devices Meeting, IEDM, 2011, pp. 737-740.

(Continued)

*Primary Examiner* — George R Fourson, III
(74) *Attorney, Agent, or Firm* — Vazken Alexanian; Ryan, Mason & Lewis, LLP

(57) ABSTRACT

A method of forming a semiconductor structure includes forming a plurality of vertical field-effect transistors (VFETs) disposed on a substrate and forming a plurality of resistive elements disposed over top surfaces of the VFETs. Each pair of a given one of the plurality of VFETs and a corresponding resistive element disposed over the given VFET provides a resistive random access memory (ReRAM) cell. The VFETs are arranged in two or more columns and two or more rows, wherein each column of VFETs provides a bitline of the ReRAM cells sharing a bottom source/drain region and wherein each row of VFETs provides a wordline of the ReRAM cells sharing a gate. Top source/drain regions of the VFETs provide bottom contacts for the resistive elements disposed over the VFETs.

17 Claims, 26 Drawing Sheets

(51) Int. Cl.
*H01L 21/768* (2006.01)
*H01L 29/78* (2006.01)

(52) U.S. Cl.
CPC ........ *H01L 45/1608* (2013.01); *H01L 27/115* (2013.01); *H01L 27/2481* (2013.01)

(56) References Cited

U.S. PATENT DOCUMENTS

| | | |
|---|---|---|
| 9,099,385 B2 | 8/2015 | Petti |
| 9,312,383 B1 | 4/2016 | Cheng et al. |
| 9,373,783 B1 | 6/2016 | DeBrosse et al. |
| 9,525,064 B1 | 12/2016 | Balakrishnan et al. |
| 9,673,102 B2 | 6/2017 | Liu et al. |
| 2011/0006377 A1 | 1/2011 | Lee et al. |
| 2011/0017971 A1 | 1/2011 | Kim et al. |
| 2012/0080725 A1 | 4/2012 | Manos et al. |
| 2012/0149184 A1 | 6/2012 | Park et al. |
| 2012/0286227 A1 | 11/2012 | Chung |
| 2013/0334488 A1 | 12/2013 | Park |
| 2014/0167030 A1 | 6/2014 | Park |
| 2014/0239247 A1 | 8/2014 | Park |
| 2016/0300886 A1 | 10/2016 | Oh et al. |

OTHER PUBLICATIONS

Z. Fang et al., "Fully CMOS-compatible 1T1R integration of vertical nanopillar GAA transistor and oxide-based RRAM cell for high-density nonvolatile memory application," IEEE Transactions on Electron Devices, vol. 60, No. 3, 2013, pp. 1108-1113.
List of IBM Patents or Patent Applications Treated as Related.

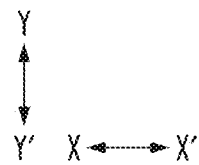
FIG. 1
100
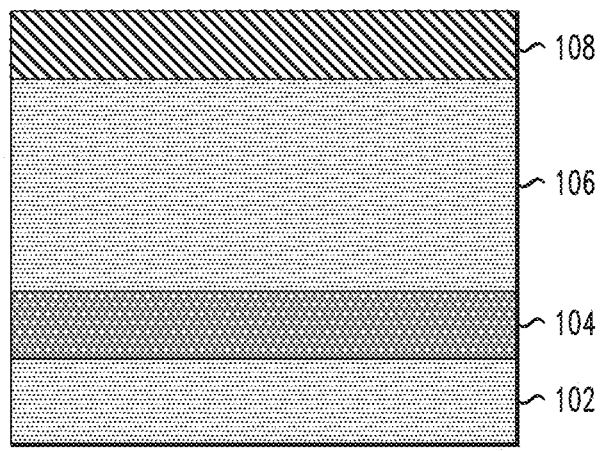
FIG. 2A
200
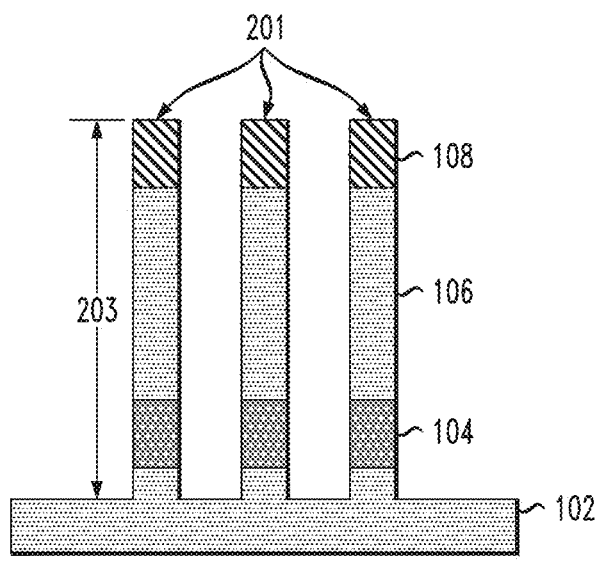

250

275

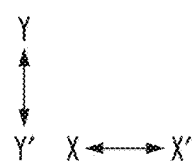
*FIG. 3A*
300
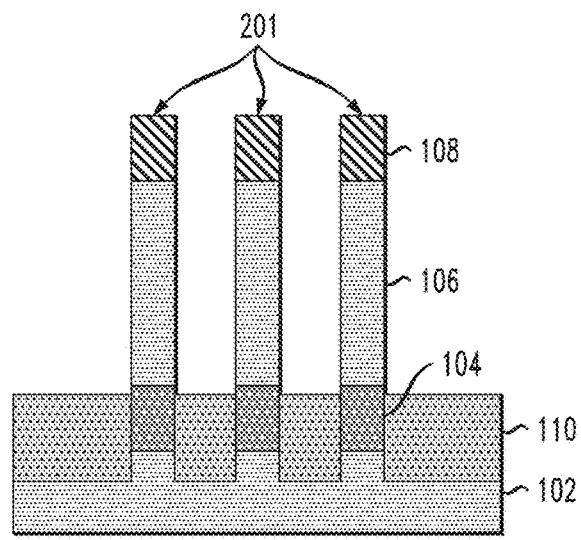
*FIG. 3B*
350
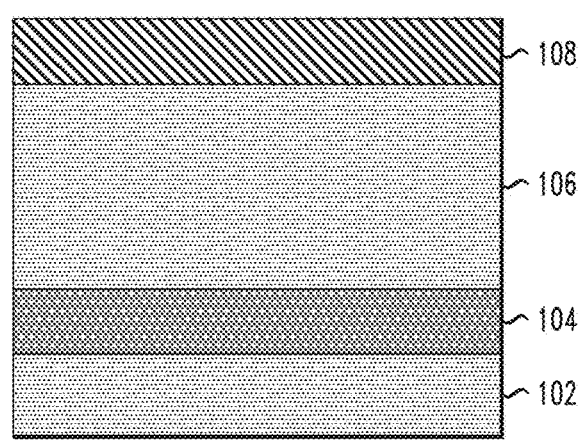

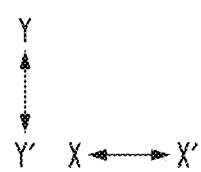
FIG. 3C
375
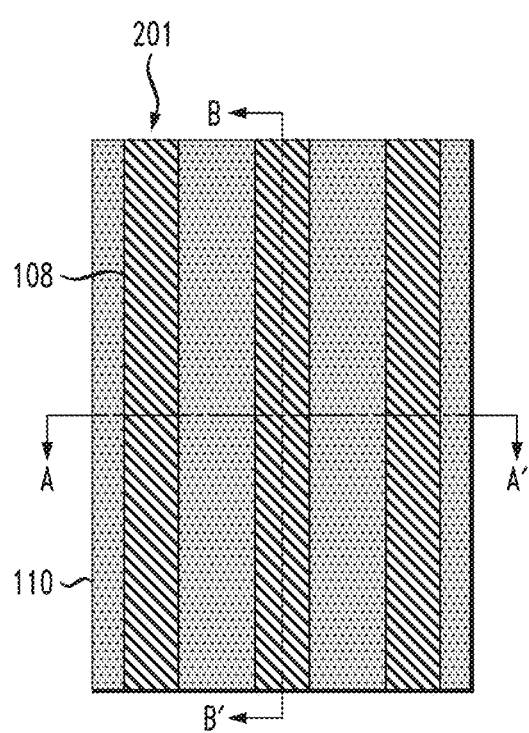

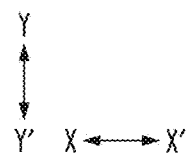
*FIG. 4A*
400
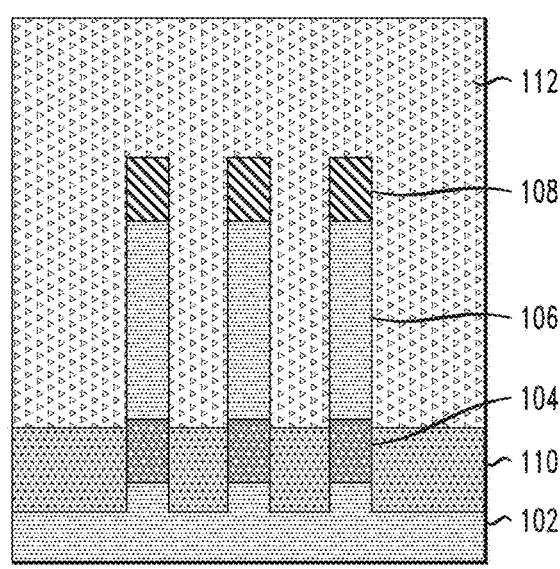
*FIG. 4B*
450
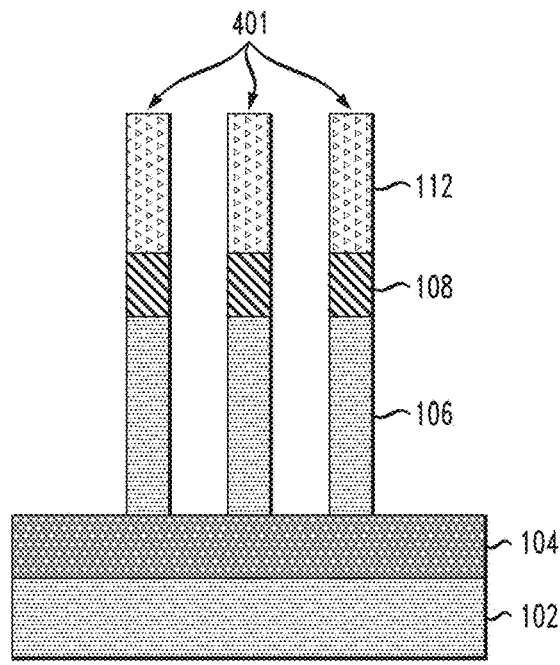

500

550

575

600

650

675

700

750

775

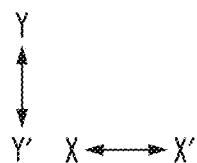
FIG. 8C
875
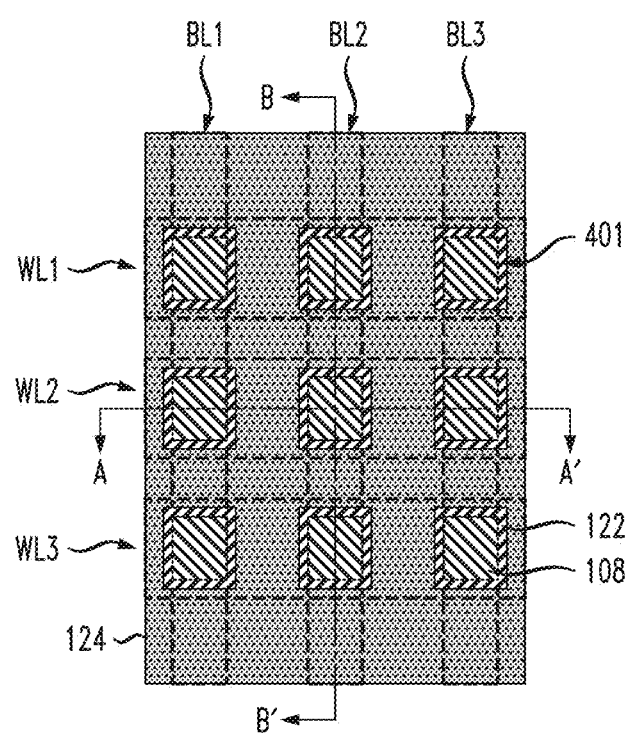

900

950

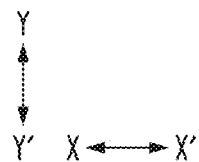
FIG. 9C
975
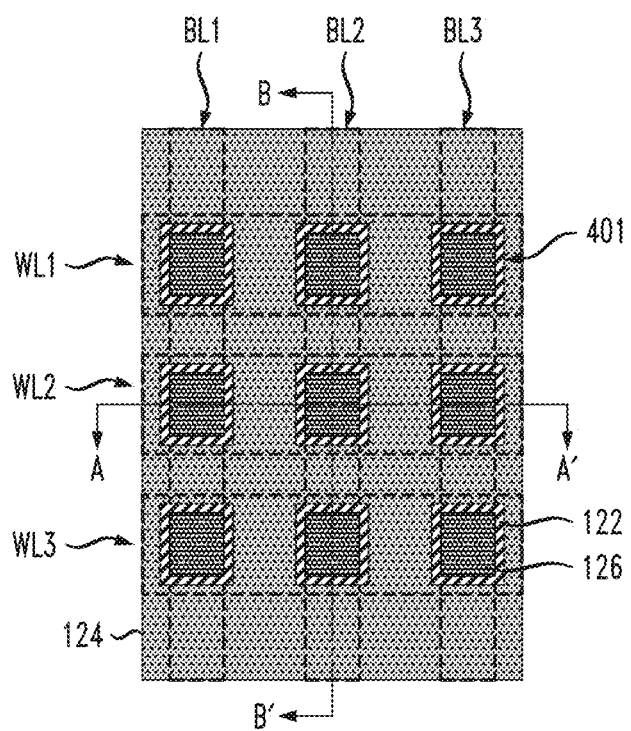

1075

1100

1150

1175

1275

1375

RESISTIVE MEMORY WITH A PLURALITY OF RESISTIVE RANDOM ACCESS MEMORY CELLS EACH COMPRISING A TRANSISTOR AND A RESISTIVE ELEMENT

BACKGROUND

The present application relates to semiconductors, and more specifically, to techniques for forming semiconductor structures. As memory density increases, the need for new memory technology other than dynamic random access memory (DRAM) is needed. DRAM technology scaling is facing a wall due to various problems such as retention time. Emerging memory devices store data as resistance values. For example, phase change memory (PCM), magnetic random access memory (MRAM), spin-torque-transfer magnetic random access memory (STT-MRAM), and resistive random access memory (ReRAM or RRAM) use variations of resistance values to store data.

SUMMARY

Embodiments of the invention provide techniques for forming on-chip resistive memory, with memory cells of the resistive memory each comprising a transistor and a resistive element.

In one embodiment, a method of forming a semiconductor structure comprises forming a plurality of vertical field-effect transistors (VFETs) disposed on a substrate and forming a plurality of resistive elements disposed over top surfaces of the VFETs. Each pair of a given one of the plurality of VFETs and a corresponding resistive element disposed over the given VFET provides a resistive random access memory (ReRAM) cell. The VFETs are arranged in two or more columns and two or more rows, wherein each column of VFETs provides a bitline of the ReRAM cells sharing a bottom source/drain region and wherein each row of VFETs provides a wordline of the ReRAM cells sharing a gate. Top source/drain regions of the VFETs provide bottom contacts for the resistive elements disposed over the VFETs.

In another embodiment, a semiconductor structure comprises a plurality of VFETs disposed on a substrate and a plurality of resistive elements disposed over top surfaces of the VFETs. Each pair of a given one of the plurality of VFETs and a corresponding resistive element disposed over the given VFET provides a ReRAM cell. The VFETs are arranged in two or more columns and two or more rows, wherein each column of VFETs provides a bitline of the ReRAM cells sharing a bottom source/drain region and wherein each row of VFETs provides a wordline of the ReRAM cells sharing a gate. Top source/drain regions of the VFETs provide bottom contacts for the resistive elements disposed over the VFETs.

In another embodiment, an integrated circuit comprises a ReRAM device comprising a plurality of ReRAM cells. Each of the plurality of ReRAM cells comprises a given one of a plurality of VFETs disposed on a substrate and a given one of a plurality of resistive elements disposed over a top surface of the given VFET. The VFETs are arranged in two or more columns and two or more rows, wherein each column of VFETs provides a bitline of the ReRAM cells sharing a bottom source/drain region and wherein each row of VFETs provides a wordline of the ReRAM cells sharing a gate. Top source/drain regions of the VFETs provide bottom contacts for the resistive elements disposed over the VFETs.

BRIEF DESCRIPTION OF THE DRAWINGS

FIG. 1 depicts a side cross-sectional view of a semiconductor structure comprising a film stack, according to an embodiment of the invention.

FIG. 2A depicts a side cross-sectional view of the FIG. 1 semiconductor structure following formation of fins, according to an embodiment of the invention.

FIG. 3A depicts a side cross-sectional view of the structure shown in FIGS. 2A-2C following formation of shallow trench isolation layers, according to an embodiment of the invention.

FIG. 3B depicts another side cross-sectional view of the structure shown in FIGS. 2A-2C following formation of the shallow trench isolation layers, according to an embodiment of the invention.

FIG. 3C depicts a top-down view of the structure shown in FIGS. 3A and 3B, according to an embodiment of the invention.

FIG. 4A depicts a side cross-sectional view of the structure shown in FIGS. 3A-3C following masking and etching to form pillars, according to an embodiment of the invention.

FIG. 4B depicts another side cross-sectional view of the structure shown in FIGS. 3A-3C following masking and etching to form the pillars, according to an embodiment of the invention.

FIG. 8C depicts a top-down view of the structure shown in FIGS. 8A and 8B, according to an embodiment of the invention.

FIG. 9C depicts a top-down view of the structure shown in FIGS. 9A and 9B, according to an embodiment of the invention.

DETAILED DESCRIPTION

Figure 2B:
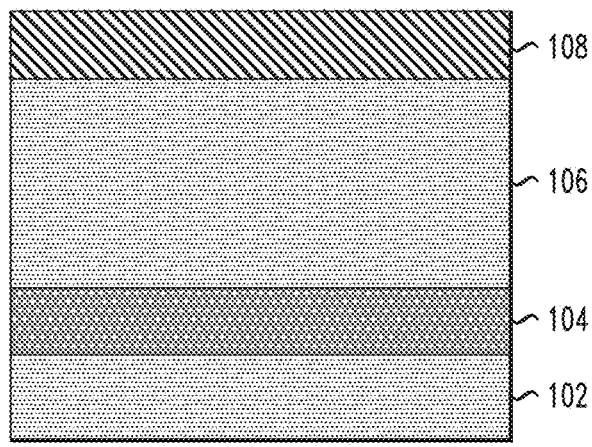
FIG. 2B depicts another side cross-sectional view of the FIG. 1 structure following formation of fins, according to an embodiment of the invention.

Illustrative embodiments of the invention may be described herein in the context of illustrative methods for forming on-chip resistive memory, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

ReRAM is a type of non-volatile (NV) random access memory (RAM), which works by changing the resistance across a dielectric solid-state material. On-chip NV memory such as ReRAM is becoming important for a variety of applications, such as system-on-chip (SoC) applications. Embodiments provide methods and structures for forming on-chip ReRAM where each ReRAM cell comprises one transistor (1T) and one resistive element (1R). In some embodiments, the transistor is a vertical field-effect transistor (VFET) so that the ReRAM can be integrated with VFET complementary metal-oxide-semiconductor (CMOS) processes.

Illustrative processes for forming on-chip resistive memory will now be described with respect to FIGS. 1-15.

FIG. 1 depicts a side cross-sectional view 100 of a semiconductor structure, comprising a substrate 102 and a film stack formed over the substrate 102. The film stack includes a doped layer 104, a semiconductor or channel layer 106 and a hard mask layer 108.

In some embodiments, the substrate 102 comprises a semiconductor substrate formed of silicon (Si), although other suitable materials may be used. For example, the substrate 102 can include any suitable substrate structure, e.g., a bulk semiconductor, a semiconductor-on-insulator (SOI) substrate, etc. in one example, the substrate 102 can include a silicon-containing material. Illustrative examples of Si-containing materials suitable for the substrate 102 can include, but are not limited to, Si, silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The substrate 102 may have a width or horizontal thickness (X-X') selected based on a number ReRAM cells that are to be formed. The substrate 102 may have a height or horizontal thickness (in direction Y-Y') that varies as desired for a particular application.

The doped layer 104 is formed over a top surface of the substrate 102. The doped layer 104 may be, for example, an N+ heavily doped semiconductor material such as silicon, although other suitable materials such as SiC or SiGe doped with phosphorus (P), arsenic (As) or antimony (Sb) may be used. The doped layer 104 is used as a bottom source/drain region for VFETs formed as described below. The doped layer 104 may have a height or vertical thickness (in direction Y-Y') in the range of 10 nanometers (nm) to 100 nm, although other heights above or below this range may be used as desired for a particular application.

The semiconductor or channel layer 106, which forms channels for the VFETs after fin pattering and further processing described below, is formed over a top surface of the doped layer 104. The semiconductor layer 106 may be formed of Si, although other suitable materials such as SiGe, SiGeC, SiC, Ge, gallium arsenide (GaAs), indium gallium arsenide (InGaAs), etc. may be used. The semiconductor layer 106 may have a height or vertical thickness (in direction Y-Y') in the range of 20 nm to 100 nm, although other heights above or below this range may be used as desired for a particular application.

A hard mask 108 is formed over a top surface of the semiconductor layer 106. The hard mask 108 may be formed of silicon nitride (SiN) although other suitable materials may be used. In various embodiments, the hard mask 104 may be an oxide such as silicon oxide (SiO), a nitride such as SiN, or an oxynitride such as silicon oxynitride (SiON), silicon oxycarbide (SiOC), silicon boron carbide nitride (SiBCN), silicon carbonitride (SiCN), or combinations thereof. In various embodiments, the hard mask 108 may be silicon nitride (SiN), for example, $Si_3N_4$. The hard mask 108 can be deposited on the semiconductor layer 106 by any suitable deposition technique, including but not limited to, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), physical vapor deposition (PVD), sputtering, plating, evaporation, spin-on-coating, ion beam deposition, electron beam deposition, laser assisted deposition, chemical solution deposition, or any combination of those methods. In some embodiments, the hard mask 108 is deposited by CVD.

The hard mask 108 may have a height or vertical thickness (in direction Y-Y') in the range of 10 nm to 100 nm, although other heights above or below this range may be used as desired for a particular application.

The doped layer 104, semiconductor layer 106 and hard mask 108 are referred to collectively as a film stack or vertical FET stack.

FIG. 2A depicts a side cross-sectional view 200 of the FIG. 1 semiconductor structure, following formation of fins 201. FIG. 2B depicts another side cross-sectional view 250 of the FIG. 1 semiconductor structure following formation of the fins 201. The side cross-sectional view 200 is taken along the line A-A in the top-down view 275 of FIG. 2C, and the side cross-sectional view 250 is taken along the line B-B in the top-down view 275 of FIG. 2C. The side cross-sectional view 200 is taken across all of the fins 201, while the side cross-sectional view 250 is taken along one of the fins 201.

The fins 201 may be formed by patterning the hard mask 108 using processing such as lithography followed by etching, sidewall image transfer (SIT) techniques such as self-aligned double patterning (SADP), self-aligned quadruple patterning (SAQP), etc. After patterning the hard mask 108, the fins 201 are formed by etching the exposed portions of the semiconductor layer 106 using, for example, reactive-ion etching (RIE) processing. As shown, the RIE to form fins 201 etches through the doped layer 104 and at least a portion of substrate 102. Thus, each resulting fin 201 may have a height or vertical thickness 203 in the range of 50 nm to 310 nm, although other heights above or below this range may be used as desired for a particular application. Each of the fins 201 may have a width or horizontal thickness (in direction X-X') in the range of 5 nm to 20 nm, although other widths above or below this range may be used as desired for a particular application.

Figure 2C:
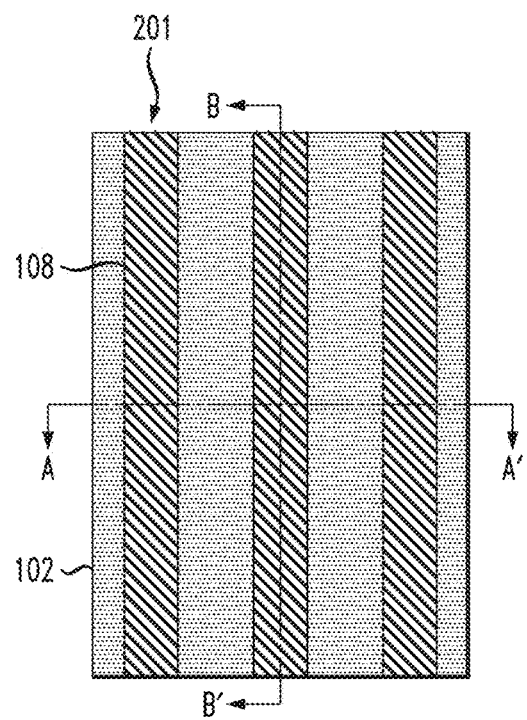
FIG. 2C depicts a top-down view of the structure shown in FIGS. 2A and 2B, according to an embodiment of the invention.

FIG. 3A depicts a side cross-sectional view 300 of the structure shown in FIGS. 2A-2C following formation of shallow trench isolation (STI) layers or regions 110 over the exposed top surface of substrate 102 surrounding each of the fins 201. FIG. 3B depicts another side cross-sectional view 350 of the structure shown in FIGS. 2A-2C following formation of STI regions 110. The side cross-sectional view 300 is taken along the line A-A in the top-down view 375 of FIG. 3C, and the side cross-sectional view 350 is taken along the line B-B in the top-down view 375 of FIG. 3C. As shown, the STI regions 110 are formed with a height that covers a portion of the doped layer 104 of each fin 201, such as a height or vertical thickness (in direction Y-Y') in the range of 10 nm to 100 nm, although other heights above or below this range may be used as desired for a particular application. As shown in FIG. 3A, the STI regions 110 do not completely cover the doped layer 104 in each fin.

Figure 4C:
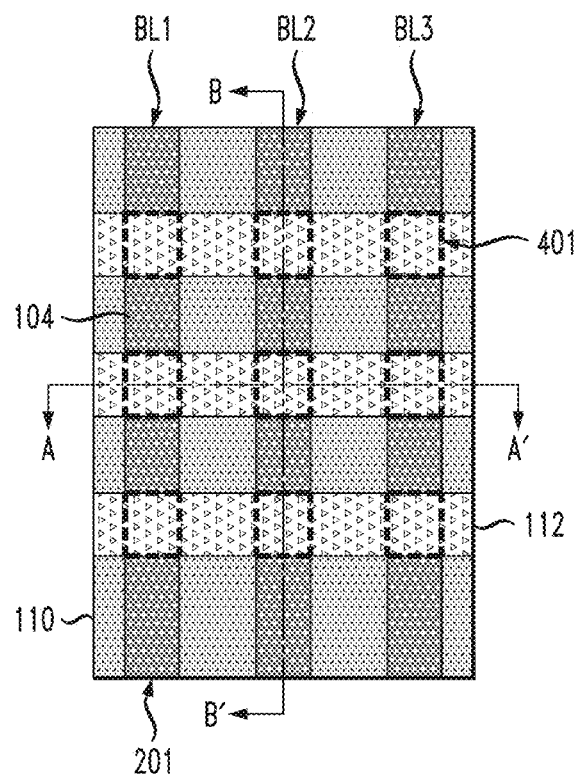
FIG. 4C depicts a top-down view of the structure shown in FIGS. 4A and 4B, according to an embodiment of the invention.

FIG. 4A depicts a side cross-sectional view 400 of the structure shown in FIGS. 3A-3C following masking and etching to form pillars 401. FIG. 4B depicts another side cross-sectional view 450 of the structure shown in FIGS. 3A-3C following masking and etching to form pillars 401. The side cross-sectional view 400 is taken along the line A-A in the top-down view 475 of FIG. 4C, and the side cross-sectional view 450 is taken along the line B-B in the top-down view 475 of FIG. 4C.

A mask layer 112 is patterned over portions of the fins 201 as illustrated in FIGS. 4A and 4B, followed by etching of the fins 201 to form pillars 401. The mask layer 112 may initially be formed over the entire structure, and then patterned using RIE or other suitable processing. The mask layer 112 may be formed of any suitable dielectric material which has enough etch selectivity relative to material of hard mask 108. The mask layer 112 may be formed to completely cover portions of the fins 201, such as with a height or vertical thickness (in direction Y-Y') in the range of 100 nm to 400 nm, although other heights above or below this range may be used as desired for a particular application.

The fins 201 are etched after patterning of mask layer 112, to form pillars 401 of the channel material (e.g., of semiconductor layer 106). The doped layer 104 remains, to form bottom source/drain regions connecting the pillars in a same column (e.g., pillars 401 on a same one of the fins 201). The doped layer 104 of each fin 201 thus serves as a bottom source/drain for bitlines denoted BL1, BL2 and BL3 in FIG. 4C (e.g., each bitline corresponds to one of the fins 201). The doped layer 104 is a shared source/drain for the pillars 401 in a same column.

Figure 5A:
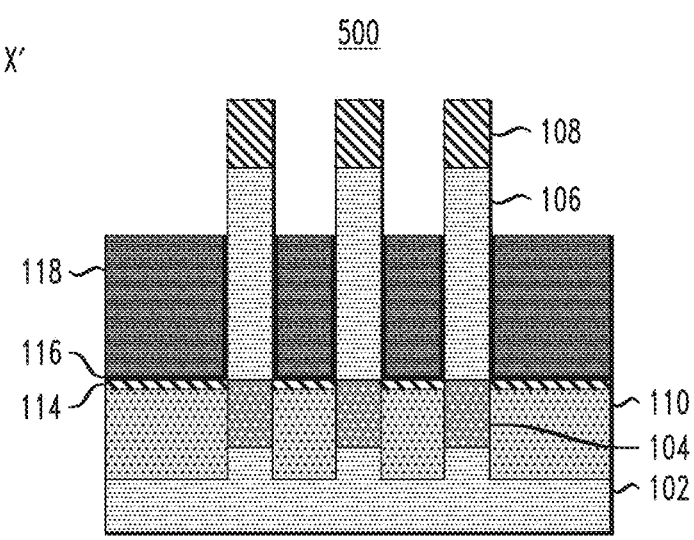
FIG. 5A depicts a side cross-sectional view of the structure shown in FIGS. 4A-4C following formation of bottom spacers, a gate dielectric and a gate conductor, according to an embodiment of the invention.
Figure 5B:
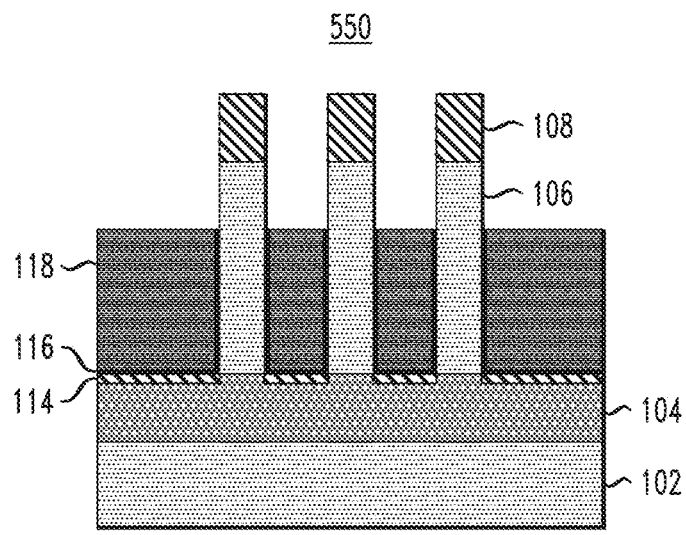
FIG. 5B depicts another side cross-sectional view of the structure shown in FIGS. 4A-4C following formation of the bottom spacers, the gate dielectric and the gate conductor, according to an embodiment of the invention.

FIG. 5A depicts a side cross-sectional view 500 of the structure shown in FIGS. 4A-4C following formation of bottom spacers 114, a gate dielectric 116 and a gate conductor 118. FIG. 5B depicts another side cross-sectional view 550 of the structure shown in FIGS. 4A-4C following formation of the bottom spacers 114, gate dielectric 116 and gate conductor 118. The side cross-sectional view 500 is taken along the line A-A in the top-down view 575 of FIG. 5C, and the side cross-sectional view 550 is taken along the line B-B in the top-down view 575 of FIG. 5C.

The bottom spacers 114 may be formed of SiN, although other suitable materials such as silicon dioxide ($SiO_2$), silicon oxynitride (SiON), silicon boron carbide nitride (SiBCN), silicon carbide oxide (SiCO), etc. may be used. The bottom spacers 114 are formed over the STI regions 112 surrounding each of the fins 201. The bottom spacers 114 may be formed using non-conformal deposition (e.g., physical vapor deposition (PVD), high density plasma (HDP) deposition), etc.) and etch back processing. The bottom spacers 114 may be formed with a height or vertical thickness (in direction Y-Y') in the range of 3 nm to 10 nm, although other heights above or below this range may be used as desired for a particular application.

A gate is formed around the vertical fin channel (e.g., semiconductor layer 106) by formation of the gate dielectric 116 over the bottom spacers 114 and surrounding the semiconductor layer 106 of each fin 201, followed by deposition of a gate conductor 118 over the gate dielectric 116. The gate dielectric 116 and gate conductor 118 are then recessed below a bottom surface of hard masks 108 to expose portions of the semiconductor or channel layer 106 of each fin 201 as illustrated in FIGS. 5A and 5B. The gate dielectric 116 and gate conductor 118 may be recessed by a combination of dry and wet etch (e.g., RIE and wet chemistry) processing.

The gate dielectric 116 may be formed of a high-k dielectric material, although other suitable materials may be used. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k may further include dopants such as lanthanum (La), aluminum (Al), and magnesium (Mg). The gate dielectric 116 may be formed using ALD or CVD processing, although other suitable processes may be used. The gate dielectric 116 has a uniform thickness in the range of 1 nm to 5 nm, although other heights above or below this range may be used as desired for a particular application.

The gate conductor 118 may be formed of any suitable conducting material, including but not limited to, doped polycrystalline or amorphous silicon, germanium (Ge), silicon germanium (SiGe), a metal (e.g., tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), gold (Au), etc.), a conducting metallic compound material (e.g., tantalum nitride (TaN), titanium nitride (TiN), tantalum carbide ($TaC_x$), titanium carbide (TiC), titanium aluminum carbide, tungsten silicide ($WSi_2$), tungsten nitride (WN), ruthenium oxide ($RuO_2$), cobalt silicide, nickel silicide, etc.), carbon nanotubes, conductive carbon, graphene, or any suitable combination of these and other suitable materials. The conductive material may further comprise dopants that are incorporated during or after deposition. In some embodiments, the gate conductor includes a work function metal (WFM) layer to set the threshold voltage of the nanosheet transistor to a desired value. The WFM may be: a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), a carbide, including but not limited to titanium carbide (TiC) titanium aluminum carbide (TiAlC), tantalum carbide (TaC), hafnium carbide (HfC); and combinations thereof.

The gate conductor 118 may be formed using ALD, CVD, plating, sputtering, PVD or other suitable processing. The gate conductor 118 may have a height or vertical thickness (in direction Y-Y') in the range of 15 nm to 80 nm, although other heights above or below this range may be used as desired for a particular application.

Figure 5C:
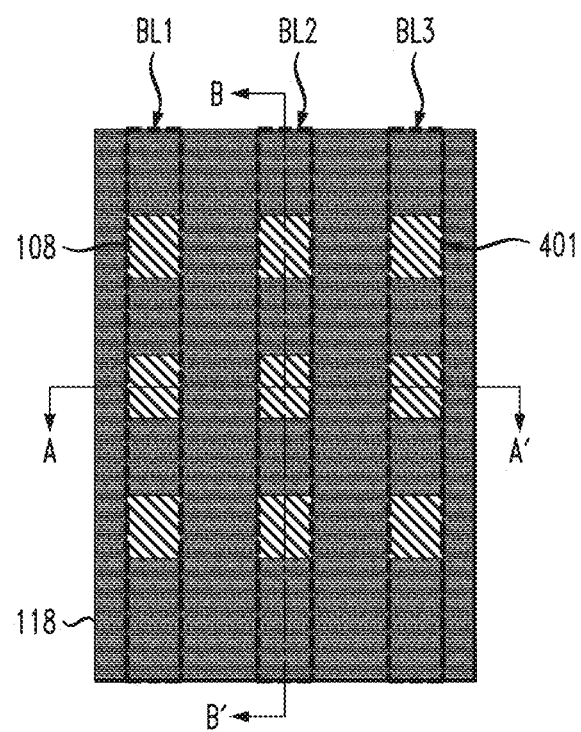
FIG. 5C depicts a top-down view of the structure shown in FIGS. 5A and 5B, according to an embodiment of the invention.
Figure 6A:
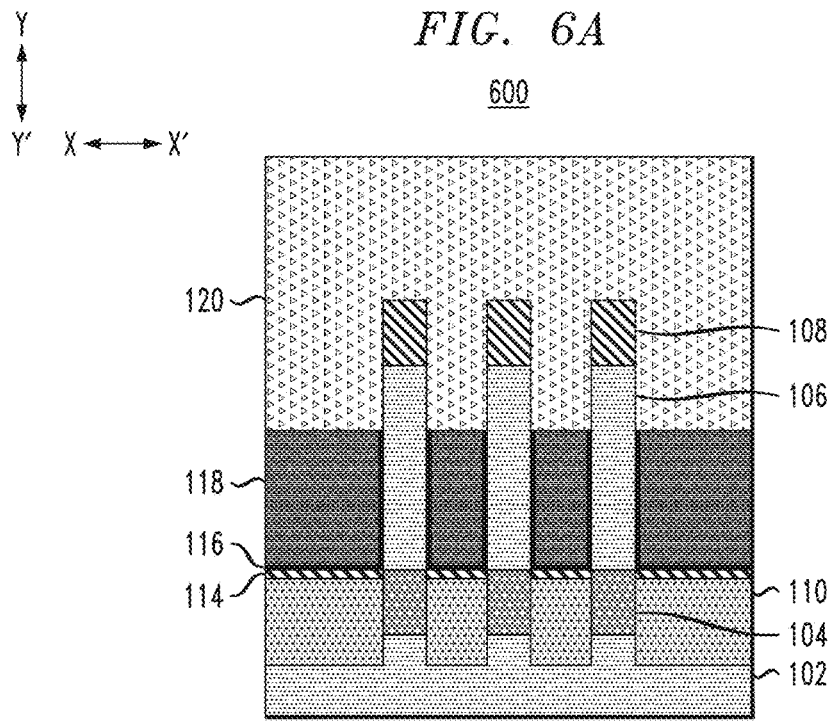
FIG. 6A depicts a side cross-sectional view of the structure shown in FIGS. 5A-5C following patterning of a gate mask, according to an embodiment of the invention.
Figure 6B:
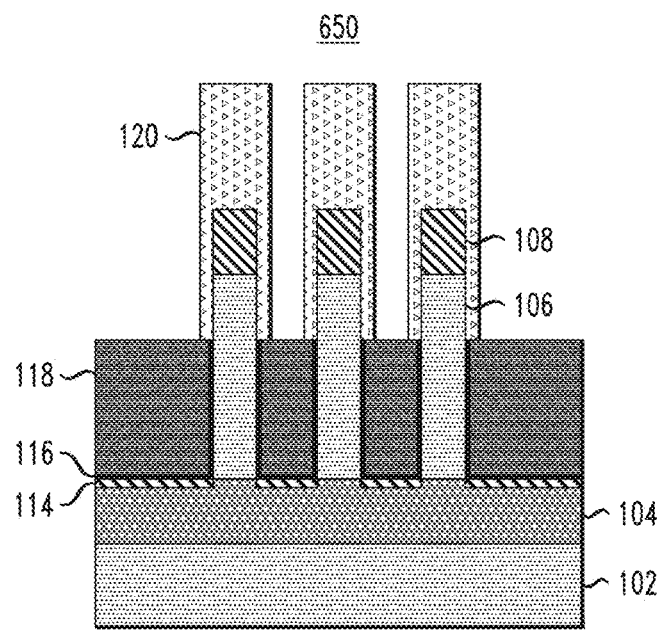
FIG. 6B depicts another side cross-sectional view of the structure shown in FIGS. 5A-5C following patterning of the gate mask, according to an embodiment of the invention.
Figure 6C:
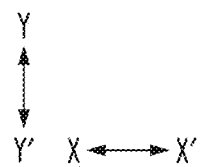
FIG. 6C depicts a top-down view of the structure shown in FIGS. 6A and 6B, according to an embodiment of the invention.
Figure 6C:
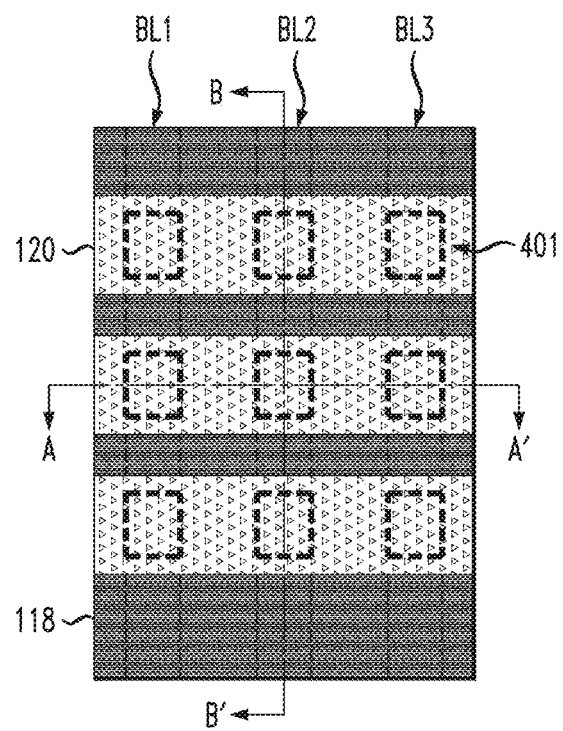

FIG. 6A depicts a side cross-sectional view 600 of the structure shown in FIGS. 5A-5C following patterning of a gate mask 120. FIG. 6B depicts another side cross-sectional view 650 of the structure shown in FIGS. 5A-5C following patterning of the gate mask 120. The side cross-sectional view 600 is taken along the line A-A in the top-down view 675 of FIG. 6C, and the side cross-sectional view 650 is taken along the line B-B in the top-down view 675 of FIG. 6C. The gate mask 120 may be formed of any suitable dielectric material (e.g., $SiO_2$) which has enough etch selectivity over material of the gate conductor 118. The gate mask 120 may initially be formed over an entire surface of the structure shown in FIGS. 5A-5C, followed by patterning over portions of the fins 201 as illustrated in FIGS. 6B and 6C. The gate mask 120 may have a height or vertical thickness (in direction Y-Y') measured from a top surface of the gate conductor 118 in the range of 20 nm to 100 nm, although other heights above or below this range may be used as desired for a particular application.

Figure 7A:
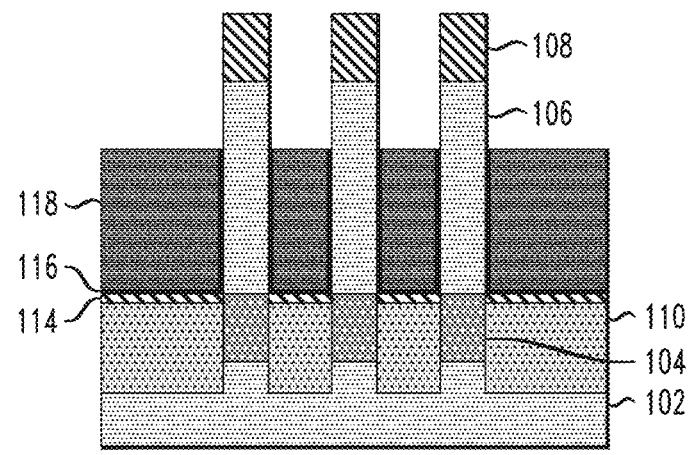
FIG. 7A depicts a side cross-sectional view of the structure shown in FIGS. 6A-6C following gate patterning, according to an embodiment of the invention.
Figure 7B:
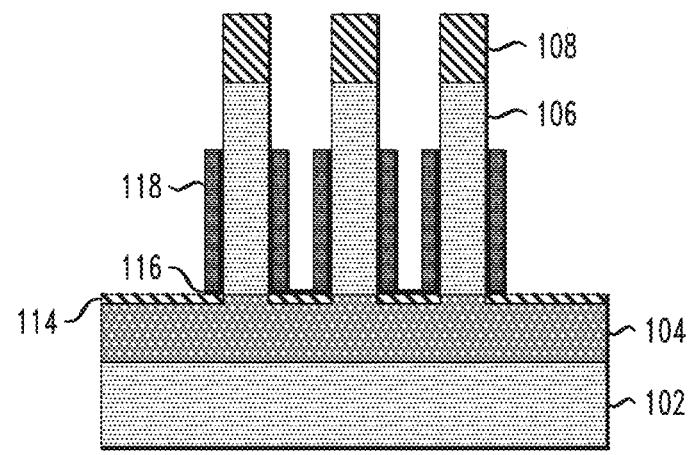
FIG. 7B depicts another side cross-sectional view of the structure shown in FIGS. 6A-6C following gate patterning, according to an embodiment of the invention.
Figure 7C:
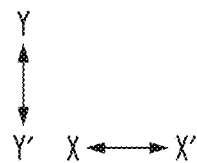
FIG. 7C depicts a top-down view of the structure shown in FIGS. 7A and 7B, according to an embodiment of the invention.
Figure 7C:
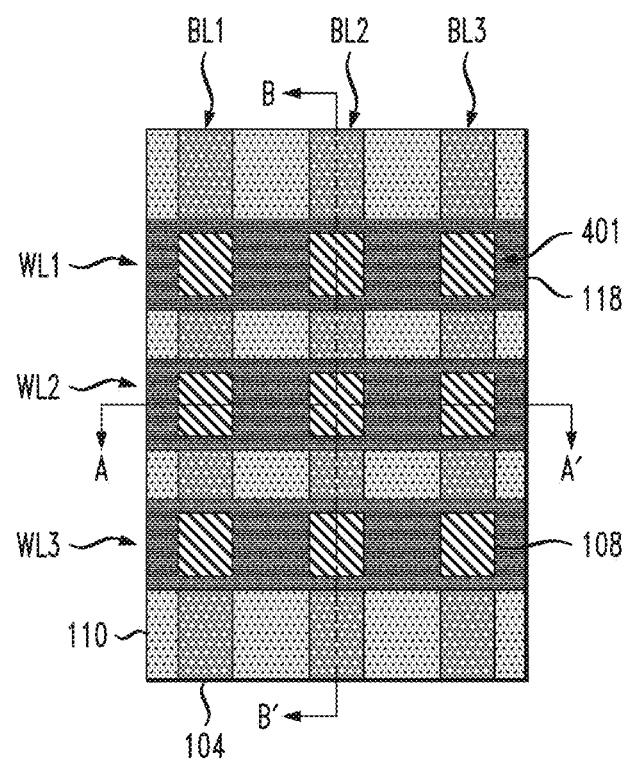

FIG. 7A depicts a side cross-sectional view 700 of the structure shown in FIGS. 6A-6C following gate patterning. FIG. 7B depicts another side cross-sectional view 750 of the structure shown in FIGS. 6A-6C following gate patterning. The side cross-sectional view 700 is taken along the line A-A in the top-down view 775 of FIG. 7C, and the side cross-sectional view 750 is taken along the line in the top-down view 775 of FIG. 7C. The gates are patterned by removing portions of the gate conductor 118 and gate dielectric 116 that are exposed by the gate mask 120. The gates are thus patterned into stripes as illustrated in FIGS. 7B and 7C, where the gate stripes form wordlines WL1, WL2 and WL3. The exposed portions of the gate conductor 118 and gate dielectric 116 may be removed using any suitable etch process or processes. As a result of the gate patterning, the gate conductor 118 surrounding each of the pillars 401 may have a thickness (as shown in FIG. 7B) in the range of 3 nm to 20 nm, although other thicknesses above or below this range may be used as desired for a particular application.

Figure 8A:
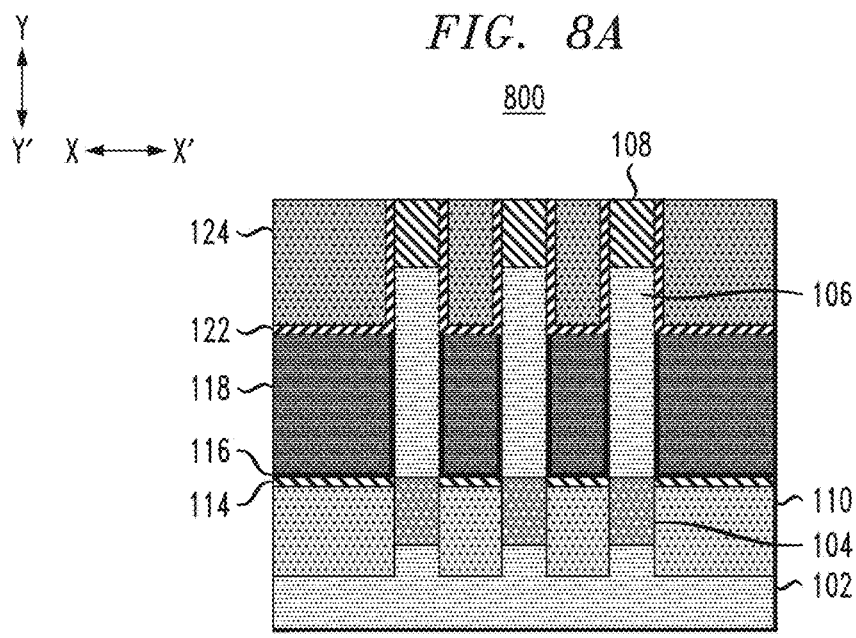
FIG. 8A depicts a side cross-sectional view of the structure shown in FIGS. 7A-7C following formation of top spacers and an interlevel dielectric, according to an embodiment of the invention.
Figure 8B:
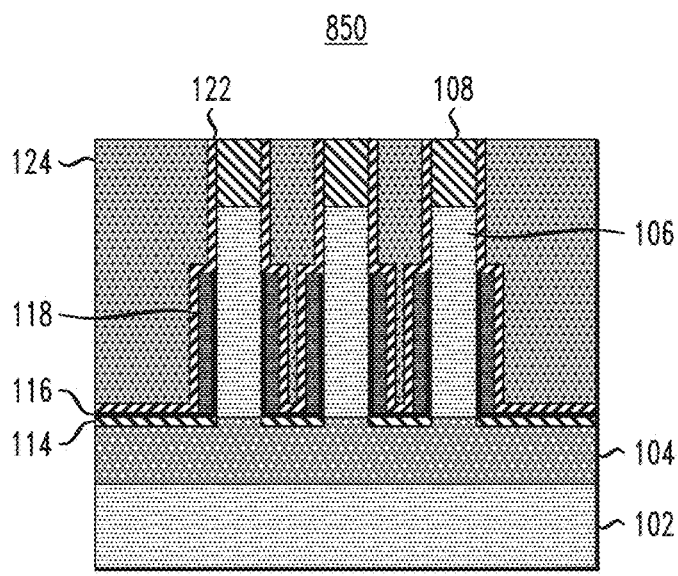
FIG. 8B depicts another side cross-sectional view of the structure shown in FIGS. 7A-7C following formation of the top spacers and the interlevel dielectric, according to an embodiment of the invention.

FIG. 8A depicts a side cross-sectional view 800 of the structure shown in FIGS. 7A-7C following formation of top spacers 122 and an interlevel dielectric (ILD) 124. FIG. 8B depicts another side cross-sectional view 850 of the structure shown in FIGS. 7A-7C following formation of the top spacers 122 and the ILD 124. The top spacers 122 may be formed of SiN, $SiO_2$, SiON, SiBCN, SiOC or another suitable material. In some embodiments, the top spacers 122 may be formed of the same material as bottom spacers 114. The top spacers 122 may be formed by a conformal deposition process such as atomic layer deposition (ALD) or chemical vapor deposition (CVD) processing with a thickness in the range of 3 nm to 10 nm, although other thicknesses above or below this range may be used as desired for a particular application.

The ILD 124 may be formed by deposition of a dielectric, followed by planarization such that a top surface of the ILD 124 matches that of a top surface of hard mask 108. The ILD 124 may be formed of an oxide, although other suitable materials may be used. The ILD 124 may be planarized using chemical mechanical polishing or planarization (CMP).

Figure 9A:
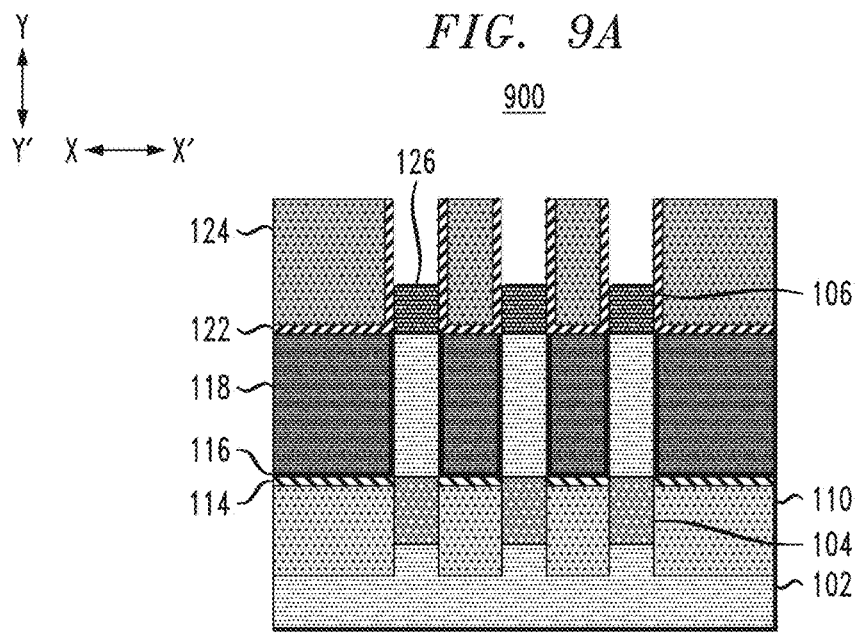
FIG. 9A depicts a side cross-sectional view of the structure shown in FIGS. 8A-8C following formation of top source/drain regions, according to an embodiment of the invention.
Figure 9B:
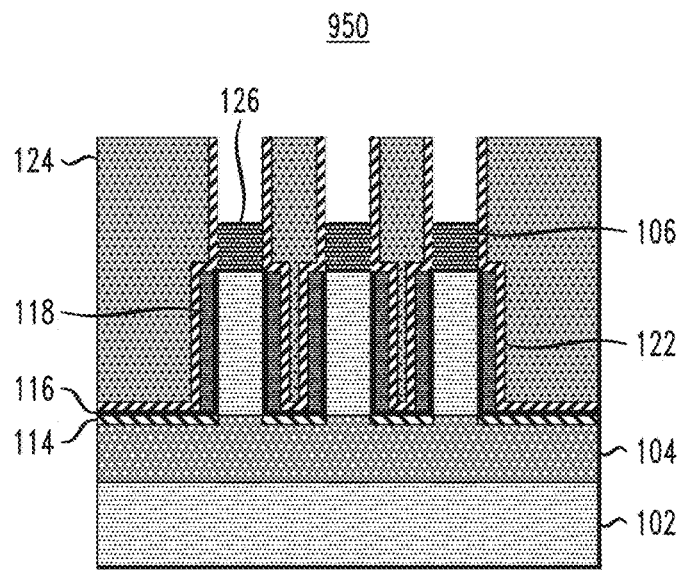
FIG. 9B depicts another side cross-sectional view of the structure shown in FIGS. 8A-8C following formation of the top source/drain regions, according to an embodiment of the invention.

FIG. 9A depicts a side cross-sectional view 900 of the structure shown in FIGS. 8A-8C following formation of top source/drain regions 126. FIG. 9B depicts another side cross-sectional view 950 of the structure shown in FIGS. 8A-8C following formation of the top source/drain regions 126. The side cross-sectional view 900 is taken along the line A-A in the top-down view 975 of FIG. 9C, and the side cross-sectional view 950 is taken along the line B-B in the top-down view 975 of FIG. 9C.

To form the top source/drain regions 126, the hard mask 108 over each of the fins 201 is removed, followed by recessing the semiconductor layer 106 of fins 201 as illustrated in FIGS. 9A and 9B. The hard mask 108 may be removed using wet chemical etch (e.g., hot phosphoric acid solution with water) processing. The semiconductor layer 106 of the fins 201 may be recessed using RIE or wet chemistry processing. The top-source/drain regions 126 may then be formed by, for example, epitaxially growing in-situ doped silicon or another suitable material.

Figure 10A:
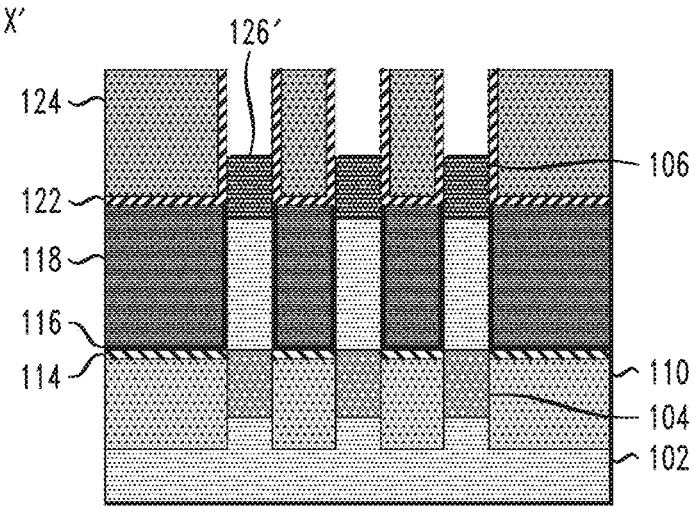
FIG. 10A depicts a side cross-sectional view of the structure shown in FIGS. 9A-9C following dopant drive in, according to an embodiment of the invention.
Figure 10B:
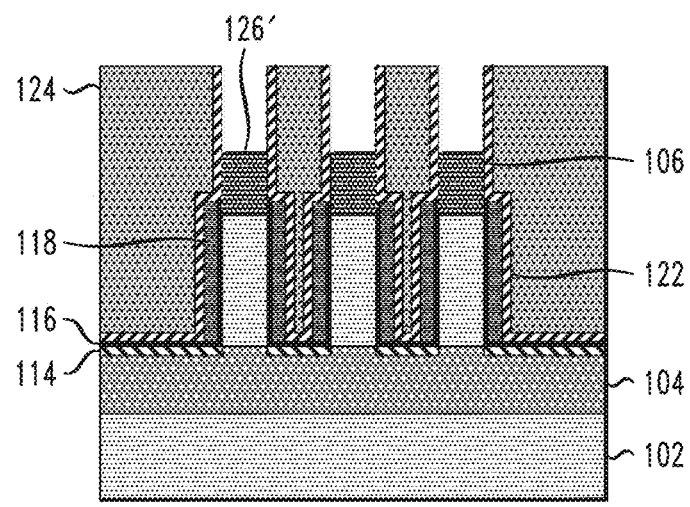
FIG. 10B depicts another side cross-sectional view of the structure shown in FIGS. 9A-9C following dopant drive in, according to an embodiment of the invention.

FIG. 10A depicts a side cross-sectional view 1000 of the structure shown in FIGS. 9A-9C following dopant drive-in. FIG. 10B depicts another side cross-sectional view 1050 of the structure shown in FIGS. 9A-9C following dopant drive in. The side cross-sectional view 1000 is taken along the line A-A in the top-down view 1075 of FIG. 10C, and the side cross-sectional view 1050 is taken along the line B-B in the top-down view 1075 of FIG. 10C. The top source/drain regions 126 may be subject to a dopant drive in process, to form junctions so that later formed ReRAM cells will not see a high thermal budget. A spike anneal (e.g., with a duration of approximately 1 second) at a temperature ranging from 900° C. to 1100° C. may be used to drive the dopant into the channel region, where the channel is underneath the top source/drain regions 126. Dopants may already be present in the top source/drain regions 126, which may be epitaxialty grown in-situ doped silicon. If the device is n-type FET (NFET), the dopant may be P, As, Sb, combinations thereof, etc. If the device is p-type FET (PFET), the dopant may be boron (B), gallium (Ga), combinations thereof, etc.

As illustrated in FIGS. 10A and 10B, the dopant drive in results in transformation of the top source/drain regions 126 to top source/drain regions 126', which extend further into the semiconductor layer 106 of each of the fins 201. Relative to the top source/drain regions 126, the top source/drain regions 126' may extend further into the semiconductor layer 106, transforming a portion of the semiconductor layer 106 of each fin 201 to the top source/drain regions 126'. The transformed portion of the semiconductor layer 106 of each fin 201 may have a height or vertical thickness (in direction Y-Y') in the range of 20 nm to 100 nm, although other thicknesses above or below this range may be used as desired for a particular application.

The top source/drain regions 126' of the VFETs also provide bottom contacts for the resistive elements formed over the VFETs.

Figure 10C:
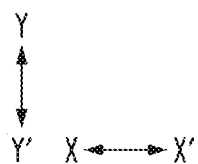
FIG. 10C depicts a top-down view of the structure shown in FIGS. 10A and 10B, according to an embodiment of the invention.
Figure 10C:
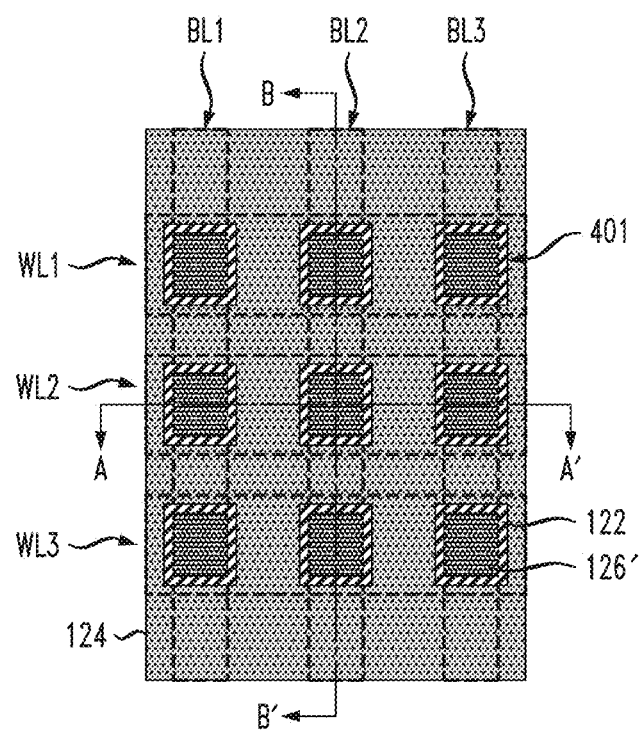
Figure 11A:
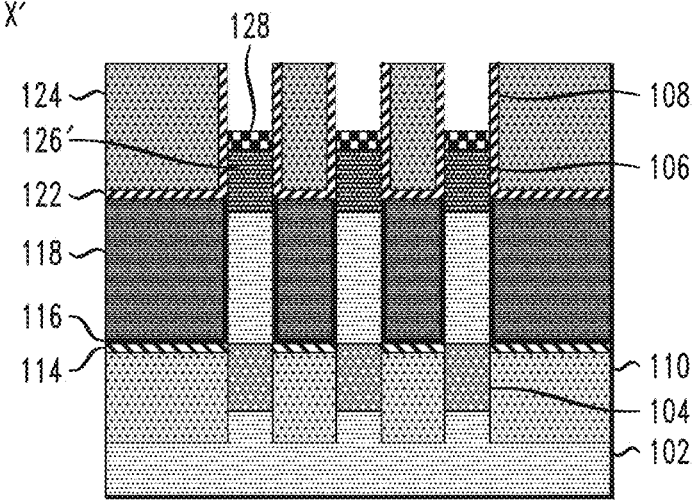
FIG. 11A depicts a side cross-sectional view of the structure shown in FIGS. 10A-10C following formation of bottom electrodes, according to an embodiment of the invention.
Figure 11B:
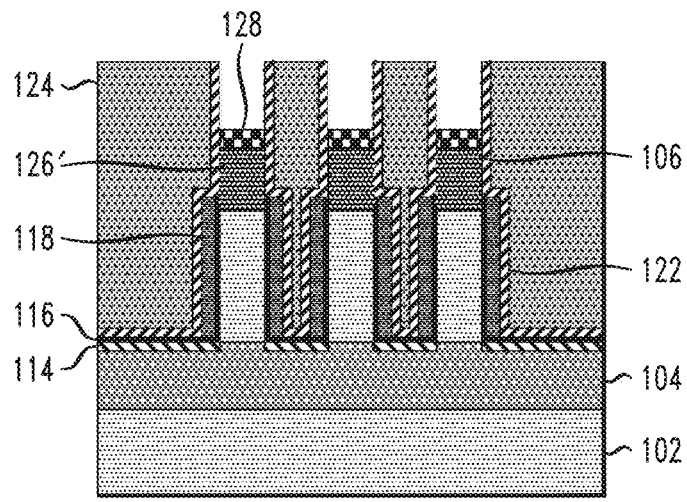
FIG. 11B depicts another side cross-sectional view of the structure shown in FIGS. 10A-10C following formation of the bottom electrodes, according to an embodiment of the invention.

FIG. 11A depicts a side cross-sectional view 1100 of the structure shown in FIGS. 10A-10C following formation of bottom electrodes 128. FIG. 11B depicts another side cross-sectional view 1150 of the structure shown in FIGS. 10A-10C following formation of the bottom electrodes 128. The side cross-sectional view 1100 is taken along the line A-A in the top-down view 1175 of FIG. 11C, and the side cross-sectional view 1150 is taken along the line B-B in the top-down view 1175 of FIG. 11C. The bottom electrodes 128 may be formed using any suitable deposition process, such as ALD, CVD or PVD, followed by recess to a height or vertical thickness (in direction Y-Y') in the range of 5 nm to 20 nm, although other thicknesses above or below this range may be used as desired for a particular application. The bottom electrodes 128 may be formed of nitrogen-rich TiN, although other suitable materials such as platinum (Pt), tantalum (Ta), nickel (Ni), etc. may be used.

Figure 11C:
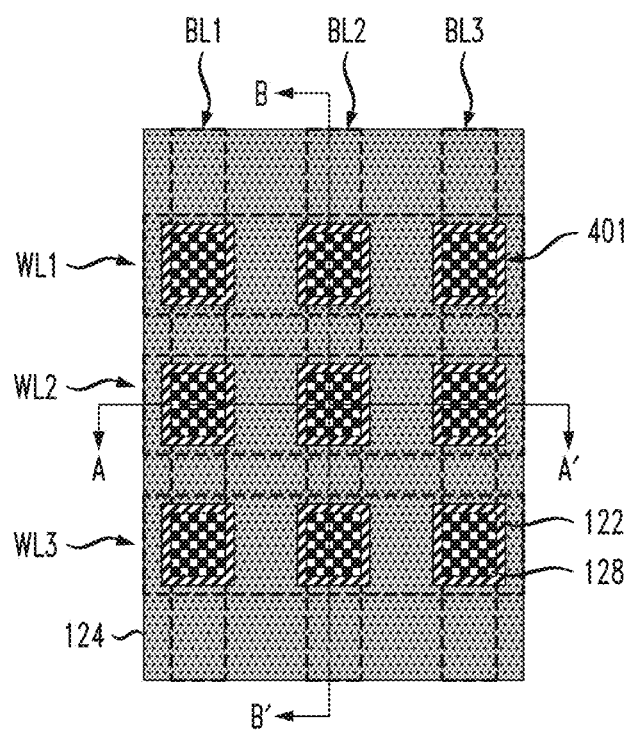
FIG. 11C depicts a top-down view of the structure shown in FIGS. 11A and 11B according to an embodiment of the invention.
Figure 12A:
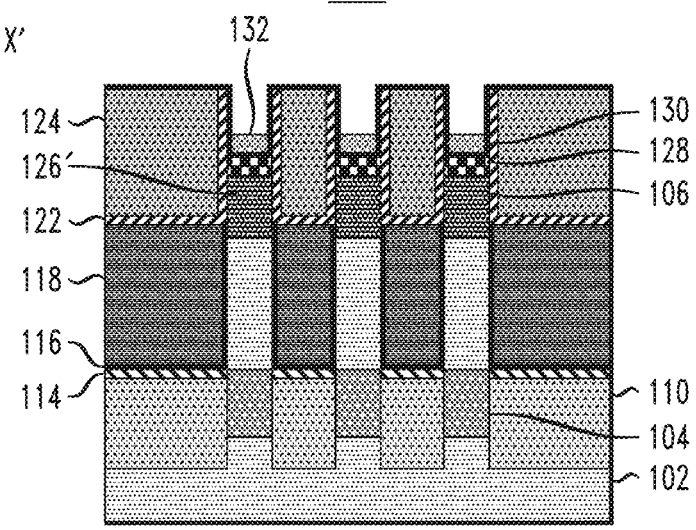
FIG. 12A depicts a side cross-sectional view of the structure shown in FIGS. 11A-11C following formation of switch material and top electrodes, according to an embodiment of the invention.
Figure 12B:
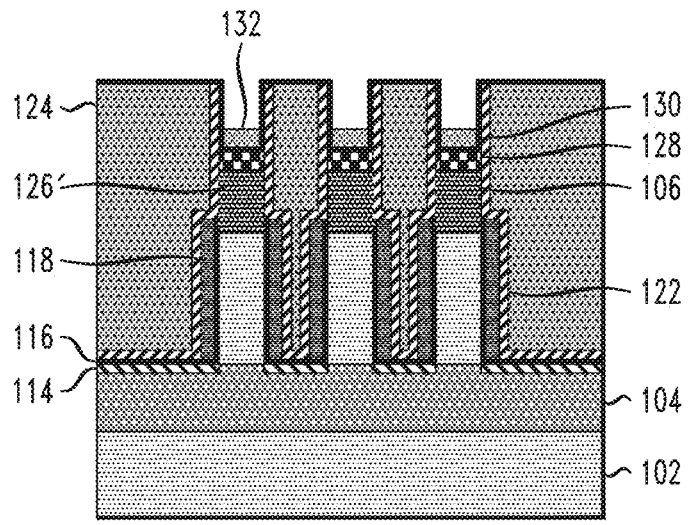
FIG. 12B depicts another side cross-sectional view of the structure shown in FIGS. 11A-11C following formation of the switch material and the top electrodes, according to an embodiment of the invention.

FIG. 12A depicts a side cross-sectional view 1200 of the structure shown in FIGS. 11A-11C following formation of switch material 130 and top electrodes 132. FIG. 12B depicts a side cross-sectional view 1250 of the structure shown in FIGS. 11A-11C following formation of the switch material 130 and top electrodes 132. The switch material 130 may be deposited using ALD, CVD or PVD processing. The switch material 132 may comprise hafnium oxide ($HfO_x$) although other suitable materials such as tantalum oxide ($TaO_2$), titanium oxide ($TiO_2$), nickel oxide ($NiO_2$), cerium oxide ($CeO_2$), praseodymium oxide ($Pr_2O_3$) and combinations thereof, etc., may be used. The material of top electrodes 132 may be deposited using ALD, CVD or PVD processing, followed by recess of the material of top electrodes 132 to expose the switch material 130 on sidewalls of the trenches (formed by removal of the hard mask 108 and recess of the semiconductor layer 106 over each of the fins 201). The top electrodes 132 may be formed of titanium-rich TiN, although other suitable materials such as titanium aluminum carbide (TiAlC) or erbium (Er) may be used.

The bottom electrodes 128 and top electrodes 132, as discussed above, may both be formed of TiN. The bottom electrodes 128 are formed of nitrogen-rich TiN, where an atomic percentage of nitrogen in the TiN is in the range of 30 to 50%, with the top electrodes 132 being formed of titanium-rich TiN, where an atomic percentage of titanium in the TiN is in the range of 70 to 90%. The bottom electrodes 128 and top electrodes 132, however, are not limited to being formed of TiN. As discussed above, other suitable materials for the bottom electrodes 128 and top electrodes 132 may be used.

Figure 12C:
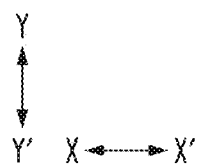
FIG. 12C depicts a top-down view of the structure shown in FIGS. 12A and 12B, according to an embodiment of the invention.
Figure 12C:
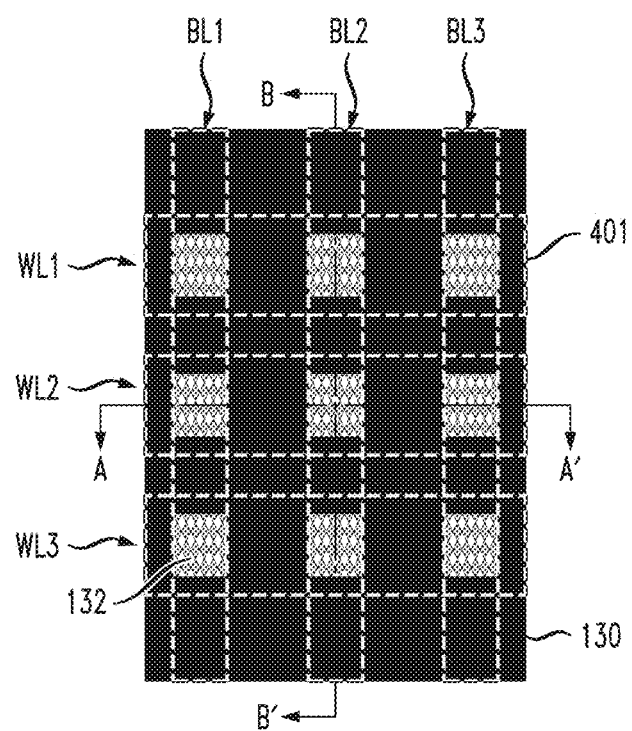
Figure 13A:
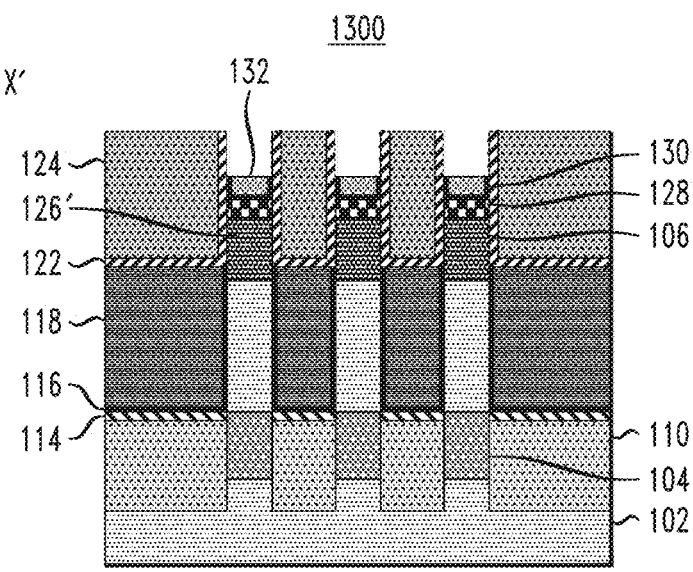
FIG. 13A depicts a side cross-sectional view of the structure shown in FIGS. 12A-12C following removal of portions of the switch material, according to an embodiment of the invention.
Figure 13B:
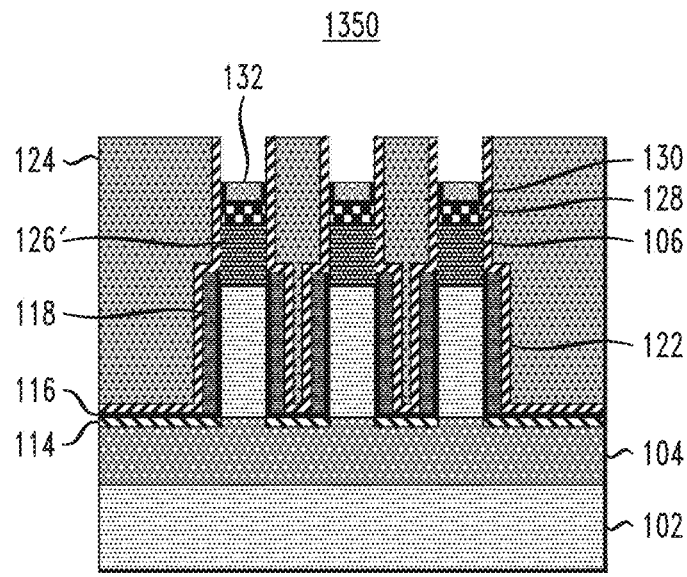
FIG. 13B depicts another side cross-sectional view of the structure shown in FIGS. 12A-12C following removal of portions of the switch material, according to an embodiment of the invention.
Figure 13C:
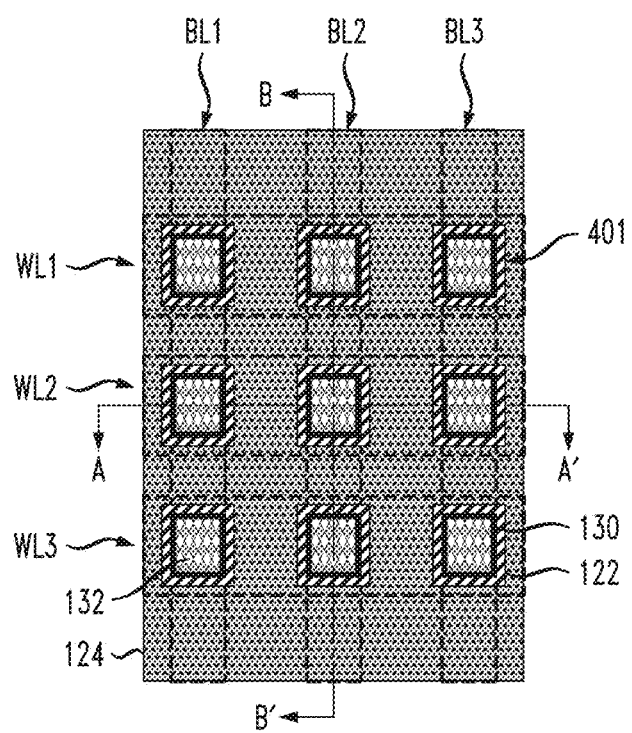
FIG. 13C depicts a top-down view of the structure shown in FIGS. 13A and 13B, according to an embodiment of the invention.

FIG. 13A depicts a side cross-sectional view 1300 of the structure shown in FIGS. 12A-12C following removal of portions of the switch material 130. FIG. 13B depicts a side cross-sectional view 1350 of the structure shown in FIGS. 12A-12C following removal of portions of the switch material 130. The side cross-sectional view 1300 is taken along the line A-A in the top-down view 1375 of FIG. 13C, and the side cross-sectional view 1350 is taken along the line B-B in the top-down view 1375 of FIG. 13C. As shown in FIGS. 13A-13C, the switch material 130 is removed from sidewalls of the trenches, so that the switch material 130 will be sealed by later processing described below. More particularly, the switch material 130 may be removed by wet chemistry (e.g., a diluted hydrofluoric plus hydrochloric acid (HF+HCl) solution) processing, so as to have a height on sidewalk of the trenches that matches that of the top surface of top electrodes 132.

Figure 14A:
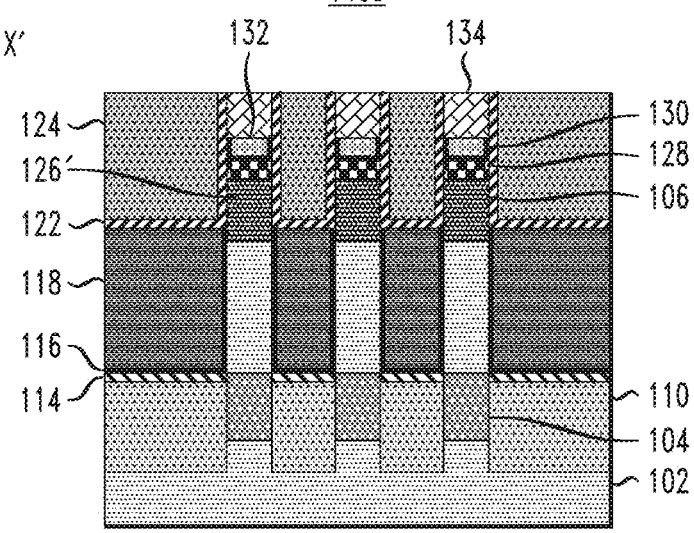
FIG. 14A depicts a side cross-sectional view of the structure shown in FIGS. 13A-13C following formation of top contacts, according to an embodiment of the invention.
Figure 14B:
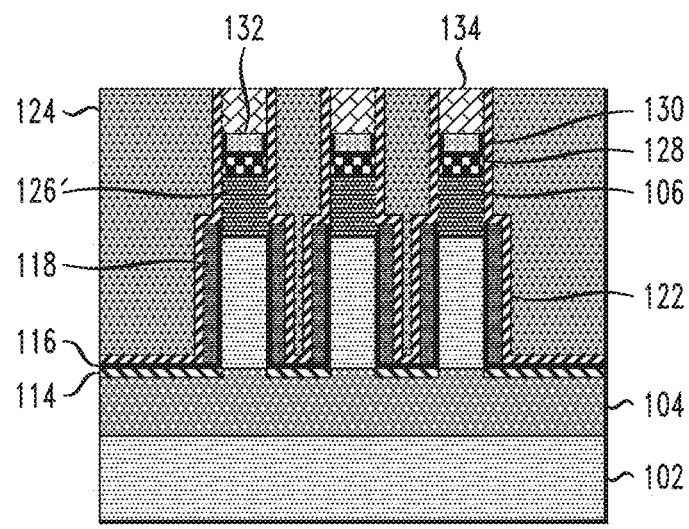
FIG. 14B depicts another side cross-sectional view of the structure shown in FIGS. 13A-13C following formation of the top contacts, according to an embodiment of the invention.
Figure 14C:
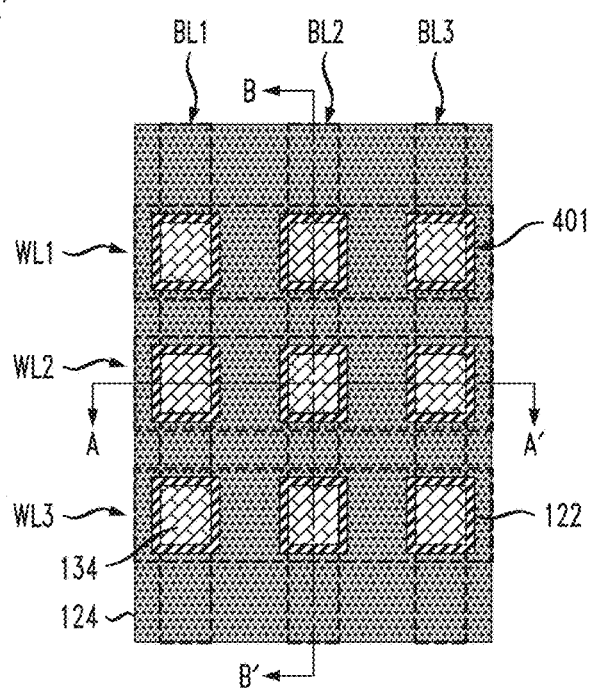
FIG. 14C depicts a top-down view of the structure shown in FIGS. 14A and 14B, according to an embodiment of the invention.

FIG. 14A depicts a side cross-sectional view 1400 of the structure shown in FIGS. 13A-13C following formation of top contacts 134. FIG. 14B depicts a side cross-sectional view 1450 of the structure shown in FIGS. 13A-13C following formation of the top contacts 134. The side cross-sectional view 1400 is taken along the line A-A in the top-down view 1475 of FIG. 14C, and the side cross-sectional view 1450 is taken along the line B-B in the top-down view 1475 of FIG. 14C. The top contacts 134 may be formed by deposition of a contact material, followed by planarization (e.g., using CMP) such that a top surface of top contacts 132 matches a top surface of the ILD 124. The top contacts 134 may be formed of tungsten (W), although other suitable materials such as cobalt (Co), copper (Cu), etc. may be used.

The processing described above with respect to FIGS. 1-14 may thus be used to form on-chip ReRAM, where each ReRAM cell comprises one VFET transistor (1T) and one resistive element (1R).

Figure 15:
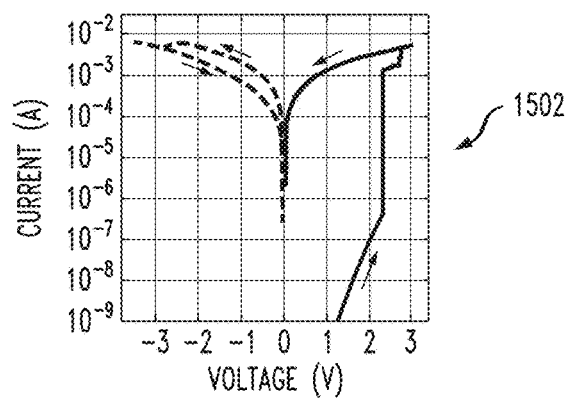
FIG. 15 depicts a plot showing current and voltage characteristics of a metal-insulator-metal resistive random-access memory structure, according to an embodiment of the invention.

FIG. 15 depicts a metal-insulator-metal (MIM) ReRAM structure 1500, and a plot 1502 showing current and voltage characteristics of the MIM ReRAM structure 1500. The MIM ReRAM structure 1500 includes a layered structure of nitrogen-rich TiN (e.g., a bottom electrode), hafnium oxide ($HfO_2$) (e.g., a switch material) and titanium-rich TiN (e.g., a top electrode).

In some embodiments, a method of forming a semiconductor structure comprises forming a plurality of VFETs disposed on a substrate and forming a plurality of resistive elements disposed over top surfaces of the VFETs. Each pair of a given one of the plurality of VFETs and a corresponding resistive element disposed over the given VFET provides a ReRAM cell. The VFETs are arranged in two or more columns and two or more rows, wherein each column of VFETs provides a bitline of the ReRAM cells sharing a bottom source/drain region and wherein each row of VFETs provides a wordline of the ReRAM cells sharing a gate. Top source/drain regions of the VFETs provide bottom contacts for the resistive elements disposed over the VFETs.

Forming the plurality of VFETs may comprise forming a doped layer disposed over a top surface of the substrate, forming a channel layer disposed over a top surface of the doped layer, and forming a hard mask layer disposed over a top surface of the channel layer.

Forming the plurality of VFETs may further comprise patterning the hard mask layer to expose portions of the channel layer, etching exposed portions of the channel layer, the doped layer and portions of the substrate to form two or more fins, and forming shallow trench isolation regions disposed over the top surface of the substrate surrounding the two or more fins.

Forming the plurality of VFETs may further comprise forming a mask layer disposed over the two or more fins, patterning the mask layer to expose portions of the hard mask layer of the two or more fins, and etching exposed portions of the hard mask layer and the channels of the two or more fins to form a plurality of pillars disposed over the doped layers of the two or more fins, wherein the doped layer of each of the two or more fins provides the bottom source/drain region for a given one of the bitlines.

Forming the plurality of VFETs may further comprise forming bottom spacers disposed over the shallow trench isolation regions, forming a gate dielectric disposed over the shallow trench isolation regions and surrounding portions of the channel layer of the plurality of pillars, and forming a gate conductor disposed over the gate dielectric.

Forming the plurality of VFETs may further comprise forming a gate mask layer over the gate conductor and the gate dielectric, patterning the gate mask layer, and etching the gate dielectric and the gate conductor exposed by the gate mask layer to form gates for the rows of VFETs.

Forming the plurality of VFETs may further comprise forming top spacers disposed over the gate conductor, the gate dielectric and surrounding the channel layer and the hard mask layer of the plurality of pillars and forming an interlevel dielectric layer disposed over the top spacers.

Forming the plurality of VFETs may further comprise removing the hard mask layer disposed over each of the pillars, recessing the channel layer to a bottom surface of the top spacers, and forming top/source drain regions over top surfaces of the recessed channel layers.

Forming the plurality of VFETs may further comprise performing dopant drive in to form junctions of the top source/drain regions and the recessed channel layers.

Forming the plurality of resistive elements may comprise forming bottom electrodes disposed over top surfaces of the top source/drain regions, forming switch material disposed over top surfaces of the bottom electrodes and on portions of the sidewalls of the top spacers of each of the plurality of pillars, and forming top electrodes disposed over the switch material. The bottom electrodes may comprise nitrogen-rich TiN, the switch material may comprise $HfO_x$, and the top electrodes may comprise titanium-rich TiN. Forming the plurality of resistive elements may further comprise forming top contacts disposed over top surfaces of the top electrodes.

In some embodiments, a semiconductor structure comprises a plurality of VFETs disposed on a substrate and a plurality of resistive elements disposed over top surfaces of the VFETs. Each pair of a given one of the plurality of VFETs and a corresponding resistive element disposed over the given VFET provides a ReRAM cell. The VFETs are arranged in two or more columns and two or more rows, wherein each column of VFETs provides a bitline of the ReRAM cells sharing a bottom source/drain region and wherein each row of VFETs provides a wordline of the ReRAM cells sharing a gate. Top source/drain regions of the VFETs provide bottom contacts for the resistive elements disposed over the VFETs.

In some embodiments, an integrated circuit comprises a ReRAM device comprising a plurality of ReRAM cells. Each of the plurality of ReRAM cells comprises a given one of a plurality of VFETs disposed on a substrate and a given one of a plurality of resistive elements disposed over a top surface of the given VFET. The VFETs are arranged in two or more columns and two or more rows, wherein each column of VFETs provides a bitline of the ReRAM cells sharing a bottom source/drain region and wherein each row of VFETs provides a wordline of the ReRAM cells sharing a gate. Top source/drain regions of the VFETs provide bottom contacts for the resistive elements disposed over the VFETs.

The VFETs may comprise a plurality of fins disposed over the substrate, each of the plurality of fins comprising a doped layer disposed over the substrate providing the bottom source/drain regions for a respective bitline of the ReRAM cells, shallow trench isolation regions disposed over the substrate surrounding the doped layer of each of the plurality of fins, a plurality of pillars disposed over each of the fins, each pillar comprising a channel disposed over the doped layer and one of the top source/drain region disposed over the channel, bottom spacers disposed over the shallow trench isolation regions surrounding the fins and disposed over the doped layer surrounding the pillars, the gates formed over the bottoms spacers surrounding each of the pillars, each of the gates comprising a gate dielectric and a gate conductor disposed surrounding a row of the pillars providing a respective wordline of the ReRAM cells, top spacers disposed over the plurality of gates surrounding each of the pillars, an interlevel dielectric disposed over the top spacers surrounding each of the pillars, and the top source/drain regions disposed over the channel in each of the pillars.

The resistive elements may comprise bottom electrodes disposed over the top source/drain regions of the VFETs, a switch material disposed over the bottom electrodes and a portion of sidewalls of the top spacers, top electrodes disposed over the switch material, and top contacts formed over the top electrodes. The bottom electrodes comprise nitrogen-rich TiN, the switch material may comprises $HfO_x$, and the top electrodes may comprise titanium-rich TiN.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw water form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:

forming a plurality of vertical field-effect transistors (VFETs) disposed on a substrate; and
forming a plurality of resistive elements disposed over top surfaces of the VFETs;
wherein each pair of a given one of the plurality of VFETs and a corresponding resistive element disposed over the given VFET provides a resistive random access memory (ReRAM) cell;
wherein the VFETs are arranged in two or more columns and two or more rows;
wherein each column of VFETs provides a bitline of the ReRAM cells sharing a bottom source/drain region;
wherein each row of VFETs provides a wordline of the ReRAM cells sharing a gate;
wherein top source/drain regions of the VFETs provide bottom contacts for the resistive elements disposed over the VFETs; and
wherein the plurality of VFETs comprise a plurality of fins disposed over the substrate, and further comprising forming a plurality of pillars disposed over each of the plurality of fins, each pillar comprising a channel and one of the top source/drain regions disposed over the channel.

2. The method of claim 1, wherein each of the plurality of fins comprising a doped layer disposed over the substrate providing the bottom source/drain regions for a respective bitline of the ReRAM cells.

3. The method of claim 1, further comprising forming top spacers for each of the plurality of pillars.

4. The method of claim 3, wherein forming the plurality of resistive elements comprises:

forming bottom electrodes disposed over top surfaces of the top source/drain regions;
forming switch material disposed over top surfaces of the bottom electrodes and on portions of sidewalls of top spacers of each of the pillars; and
forming top electrodes disposed over the switch material.

5. The method of claim 4, wherein the bottom electrodes comprise nitrogen-rich titanium nitride (TiN), the switch material comprises hafnium oxide ($HfO_x$), and the top electrodes comprise titanium-rich TiN.

6. The method of claim 5, wherein forming the plurality of resistive elements further comprises forming top contacts disposed over top surfaces of the top electrodes.

7. A semiconductor structure, comprising:

a plurality of vertical field-effect transistors (VFETs) disposed on a substrate; and
a plurality of resistive elements disposed over top surfaces of the VFETs;
wherein each pair of a given one of the plurality of VFETs and a corresponding resistive element disposed over the given VFET provides a resistive random access memory (ReRAM) cell;
wherein the VFETs are arranged in two or more columns and two or more rows;
wherein each column of VFETs provides a bitline of the ReRAM cells sharing a bottom source/drain region;
wherein each row of VFETs provides a wordline of the ReRAM cells sharing a gate;
wherein top source/drain regions of the VFETs provide bottom contacts for the resistive elements disposed over the VFETs; and
wherein the plurality of VFETs comprise a plurality of fins disposed over the substrate, and further comprising a plurality of pillars disposed over each of the plurality of fins, each pillar comprising a channel and one of the top source/drain regions disposed over the channel.

8. The semiconductor structure of claim 7, wherein each of the plurality of fins comprising a doped layer disposed over the substrate providing the bottom source/drain regions for a respective bitline of the ReRAM cells.

9. The semiconductor structure of claim 7, further comprising top spacers for each of the plurality of pillars.

10. The semiconductor structure of claim 9, wherein the plurality of resistive elements comprise:
   bottom electrodes disposed over top surfaces of the top source/drain regions;
   switch material disposed over top surfaces of the bottom electrodes and on portions of sidewalls of top spacers of each of the pillars; and
   top electrodes disposed over the switch material.

11. The semiconductor structure of claim 10, wherein the bottom electrodes comprise nitrogen-rich titanium nitride (TiN), the switch material comprises hafnium oxide ($HfO_x$), and the top electrodes comprise titanium-rich TiN.

12. The semiconductor structure of claim 11, wherein the plurality of resistive elements further comprises top contacts disposed over top surfaces of the top electrodes.

13. An integrated circuit comprising:
   a resistive random access memory (ReRAM) device comprising a plurality of ReRAM cells, each of the plurality of ReRAM cells comprising:
      a given one of a plurality of vertical field-effect transistors (VFETs) disposed on a substrate; and
      a given one of a plurality of resistive elements disposed over a top surface of the given VFET;
   wherein the VFETs are arranged in two or more columns and two or more rows;
   wherein each column of VFETs provides a bitline of the ReRAM cells sharing a bottom source/drain region;
   wherein each row of VFETs provides a wordline of the ReRAM cells sharing a gate;
   wherein top source/drain regions of the VFETs provide bottom contacts for the resistive elements disposed over the VFETs; and
   wherein the plurality of VFETs comprise a plurality of fins disposed over the substrate, and further comprising a plurality of pillars disposed over each of the plurality of fins, each pillar comprising a channel and one of the top source/drain regions disposed over the channel.

14. The integrated circuit of claim 13, wherein each of the plurality of fins comprising a doped layer disposed over the substrate providing the bottom source/drain regions for a respective bitline of the ReRAM cells.

15. The integrated circuit of claim 13, further comprising top spacers for each of the plurality of pillars.

16. The integrated circuit of claim 15, wherein the plurality of resistive elements comprise:
   bottom electrodes disposed over top surfaces of the top source/drain regions;
   switch material disposed over top surfaces of the bottom electrodes and on portions of sidewalls of top spacers of each of the pillars; and
   top electrodes disposed over the switch material.

17. The integrated circuit of claim 16, wherein the bottom electrodes comprise nitrogen-rich titanium nitride (TiN), the switch material comprises hafnium oxide ($HfO_x$), and the top electrodes comprise titanium-rich TiN.

* * * * *